United States Patent
Miller et al.

(10) Patent No.: US 11,297,712 B2
(45) Date of Patent: Apr. 5, 2022

(54) MODULAR PRINTED CIRCUIT BOARD WAFER CONNECTOR WITH REDUCED CROSSTALK

(71) Applicant: TE Connectivity Services GmbH, Schaffhausen (CH)

(72) Inventors: Keith Edwin Miller, Manheim, PA (US); Albert Tsang, Harrisburg, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 33 days.

(21) Appl. No.: 16/830,451

(22) Filed: Mar. 26, 2020

(65) Prior Publication Data
US 2021/0307156 A1 Sep. 30, 2021

(51) Int. Cl.
*H05K 1/02* (2006.01)
*H01R 12/73* (2011.01)
*H01R 13/26* (2006.01)
*H01R 13/518* (2006.01)
*H01R 13/6471* (2011.01)

(52) U.S. Cl.
CPC ........... *H05K 1/0219* (2013.01); *H01R 12/73* (2013.01); *H01R 13/26* (2013.01); *H01R 13/518* (2013.01); *H01R 13/6471* (2013.01)

(58) Field of Classification Search
CPC .. H01R 13/26; H01R 13/518; H01R 13/6471; H01R 13/6585; H01R 13/6485; H01R 12/73; H01R 12/735; H01R 12/737; H05K 1/0219
USPC ..................... 439/607.11, 941, 924.1, 61, 65
See application file for complete search history.

(56) References Cited

U.S. PATENT DOCUMENTS

| | | | |
|---|---|---|---|
| 6,171,115 B1 | 1/2001 | Mickievicz et al. | |
| 6,267,604 B1 | 7/2001 | Mickievicz et al. | |
| 6,384,341 B1 | 5/2002 | Rothermel et al. | |
| 6,488,544 B1 * | 12/2002 | Hyland | H01R 13/6658 439/676 |
| 6,488,549 B1 | 12/2002 | Weller et al. | |
| 6,540,522 B2 | 4/2003 | Sipe | |
| 6,582,250 B2 | 6/2003 | Taylor et al. | |
| 6,641,438 B1 * | 11/2003 | Billman | H01R 13/6582 439/607.07 |

(Continued)

FOREIGN PATENT DOCUMENTS

EP 2 752 947 A1 7/2014

OTHER PUBLICATIONS

European Search Report, dated Aug. 26, 2021, EP 21 16 3858, European Application No. 21163858.0-1201.

*Primary Examiner* — Marcus E Harcum

(57) ABSTRACT

A circuit board for use in a modular electrical connector. Signal pathways is provided on a first surface. First ground pathways is provided on the first surface adjacent at least one of the signal pathways. Second ground pathways are provided on a second surface in line with the signal pathways. Vias extend from the first ground pathways through the circuit board to the second ground pathways, thereby placing the first ground pathways in electrical engagement with the second ground pathways. The first ground pathways, the vias and the second ground pathways extend along multiple pairs of the signal pathways and form cavities around the multiple pairs of the signal pathways to provide electrical shielding for the multiple pairs of the signal pathways.

19 Claims, 7 Drawing Sheets

(56) References Cited

U.S. PATENT DOCUMENTS

| | | | |
|---|---|---|---|
| 6,655,966 B2 | 12/2003 | Rothermel et al. | |
| 6,663,426 B2 | 12/2003 | Hasircoglu et al. | |
| 6,663,442 B1 | 12/2003 | Helster et al. | |
| 6,676,450 B2 | 1/2004 | Schroll | |
| 6,705,895 B2 | 3/2004 | Hasircoglu | |
| 6,808,399 B2 | 10/2004 | Rothermel et al. | |
| 6,808,419 B1 * | 10/2004 | Korsunsky | H01R 13/6585 439/607.23 |
| 6,811,414 B1 | 11/2004 | Consoli et al. | |
| 6,811,440 B1 | 11/2004 | Rothermel et al. | |
| 6,824,391 B2 | 11/2004 | Mickievicz et al. | |
| 6,884,117 B2 * | 4/2005 | Korsunsky | H01R 13/6585 439/607.11 |
| 6,890,214 B2 | 5/2005 | Brown et al. | |
| 6,932,649 B1 | 8/2005 | Rothermel et al. | |
| 6,945,810 B1 | 9/2005 | Morana et al. | |
| 6,964,583 B2 | 11/2005 | D'Ambrosia et al. | |
| 6,997,736 B2 | 2/2006 | Costello et al. | |
| 7,044,794 B2 | 5/2006 | Consoli et al. | |
| 7,175,445 B2 | 2/2007 | Consoli et al. | |
| 7,201,618 B2 * | 4/2007 | Ellis | H01R 13/6477 439/676 |
| 7,967,614 B1 * | 6/2011 | Cina | H01R 24/60 439/76.1 |
| 8,398,432 B1 * | 3/2013 | McClellan | H01R 13/6471 439/607.07 |
| 8,657,627 B2 * | 2/2014 | McNamara | H01R 13/6461 439/607.11 |
| 8,840,431 B2 | 9/2014 | Nguyen et al. | |
| 9,831,588 B2 * | 11/2017 | Cohen | H01R 13/11 |
| 9,997,868 B1 * | 6/2018 | Smith, Jr | H01R 13/6477 |
| 10,050,361 B1 * | 8/2018 | Sechrist | H01R 12/62 |
| 10,128,597 B2 * | 11/2018 | Smith, Jr | H01P 5/028 |
| 10,535,971 B2 | 1/2020 | Annis et al. | |
| 10,574,000 B1 * | 2/2020 | McClinton | H01R 13/6471 |
| 10,763,622 B2 * | 9/2020 | Trout | H01R 13/6582 |
| 2004/0094328 A1 * | 5/2004 | Fjelstad | H05K 3/222 174/251 |
| 2008/0038941 A1 * | 2/2008 | Bartholomew | H05K 1/0219 439/76.1 |
| 2010/0029105 A1 * | 2/2010 | Knaub | H01R 12/724 439/78 |
| 2010/0151726 A1 * | 6/2010 | Fedder | H01R 13/6587 439/540.1 |
| 2010/0151741 A1 * | 6/2010 | Fedder | H01R 13/514 439/638 |
| 2014/0154895 A1 * | 6/2014 | Poulsen | H01R 13/658 439/76.1 |
| 2015/0194754 A1 * | 7/2015 | Miller | H01R 13/6585 439/61 |
| 2019/0296469 A1 | 9/2019 | Stokoe et al. | |
| 2020/0176905 A1 * | 6/2020 | Buck | H01R 13/6471 |

* cited by examiner

MODULAR PRINTED CIRCUIT BOARD WAFER CONNECTOR WITH REDUCED CROSSTALK

FIELD OF THE INVENTION

The present invention relates to a modular connector with reduced crosstalk. In particular, the invention relates to a modular connector with printed circuit board wafer component to optimize impedance and reduce crosstalk.

BACKGROUND OF THE INVENTION

Due to the increasing complexity of electronic components, it is desirable to fit more components in less space on a circuit board or other substrate. Consequently, the spacing between electrical terminals within connectors has been reduced, while the number of electrical terminals housed in the connectors has increased, thereby increasing the need in the electrical arts for electrical connectors that are capable of handling higher and higher speeds and to do so with greater and greater pin densities. It is desirable for such connectors to have not only reasonably constant impedance levels, but also acceptable levels of impedance and cross-talk, as well as other acceptable electrical and mechanical characteristics. Therefore, there remains a need to provide appropriate shielding to preserve signal integrity and to minimize crosstalk as speeds of signals increase and the footprint of the connector remains the same or decreases.

It would, therefore, be beneficial to provide a connector which reduces crosstalk between contact pairs. It would also be beneficial to reduce crosstalk in a backplane connector and in the footprint of the printed circuit board to which the connector is assembled.

SUMMARY OF THE INVENTION

An embodiment is directed to a circuit board for use in a modular electrical connector. The circuit board has a first surface and an oppositely facing second surface. A plurality of signal pathways is provided on the first surface. A plurality of first ground pathways is provided on the first surface. Each of the plurality of first ground pathways is positioned adjacent at least one of the plurality of signal pathways. A plurality of second ground pathways are provided on the second surface. The plurality of second ground pathways are positioned in line with the plurality of the signal pathways. Vias extend from the first plurality of ground pathways through the circuit board to the second plurality of ground pathways, thereby placing the first plurality of ground pathways in electrical engagement with the second plurality of ground pathways. The first plurality of ground pathways, the vias and the second plurality of ground pathways extend along multiple pairs of the plurality of signal pathways and form cavities around the multiple pairs of the plurality of signal pathways to provide electrical shielding for the multiple pairs of the plurality of signal pathways. The spacing between the ground pathways forming the cavities and the signal pathways is such that impedance is optimized.

An embodiment is directed to a modular electrical connector with a housing having modules positioned therein. The modules have circuit boards. The circuit boards have a first surface and an oppositely facing second surface. Signal pathways are provided on the first surface. First ground pathways are provided on the first surface, with each of the first ground pathways positioned adjacent at least one of the signal pathways. Second ground pathways are provided on the second surface, the second ground pathways are positioned in line with the signal pathways. Vias extend from the first ground pathways through the circuit board to the second ground pathways, thereby placing the first ground pathways in electrical engagement with the second ground pathways. The combination of the first ground pathways, the vias and the second ground pathways of the circuit boards of the modules entirely peripherally surround pairs of signal pathways to provide electrical shielding for the pairs of signal pathways. The spacing between the ground pathways forming the cavities and the signal pathways is such that impedance is optimized.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
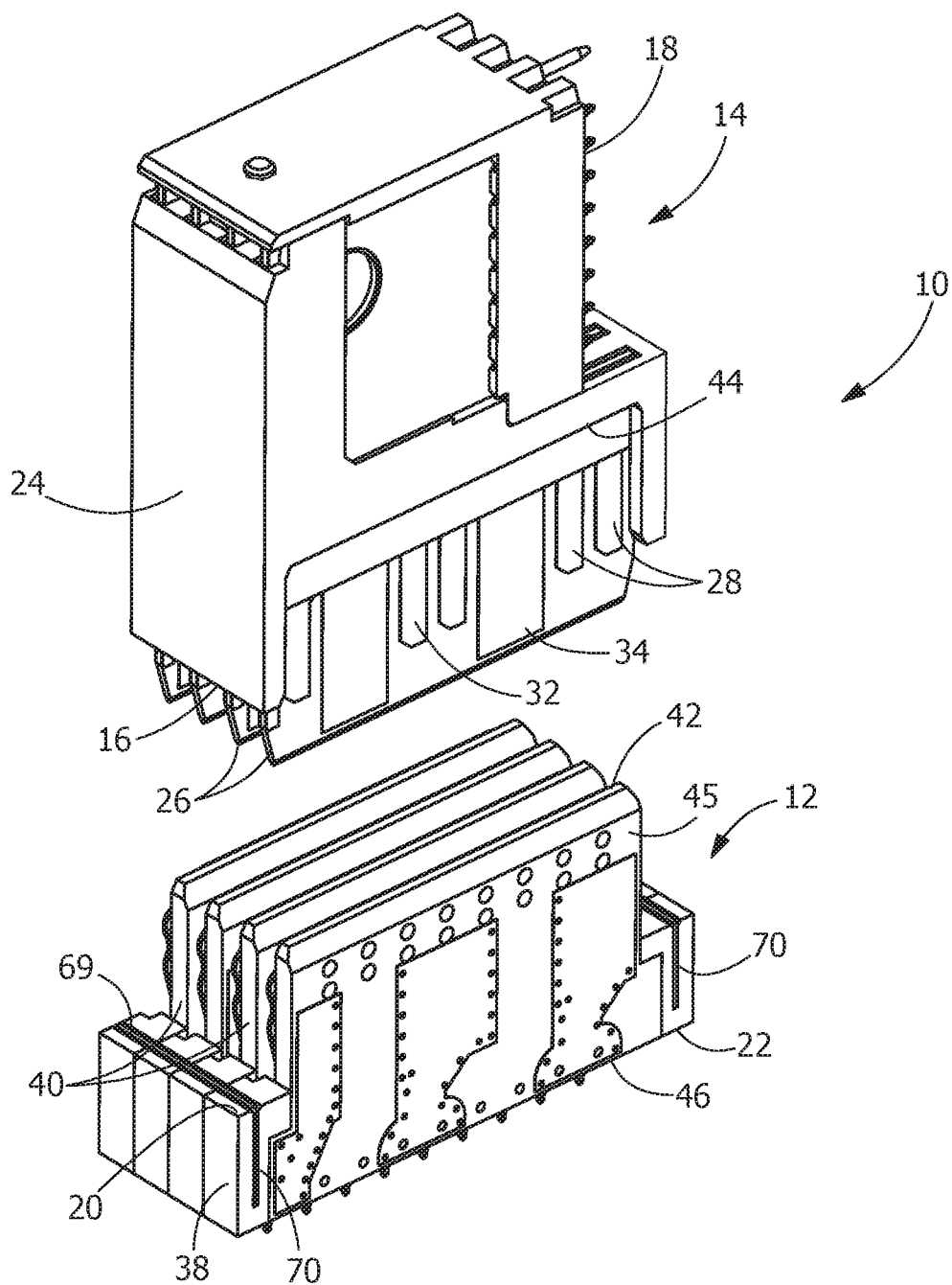
FIG. 1 is a perspective view of an illustrative backplane connector of the present invention with a mating daughtercard connector positioned above the backplane connector prior to mating therewith.
Figure 2:
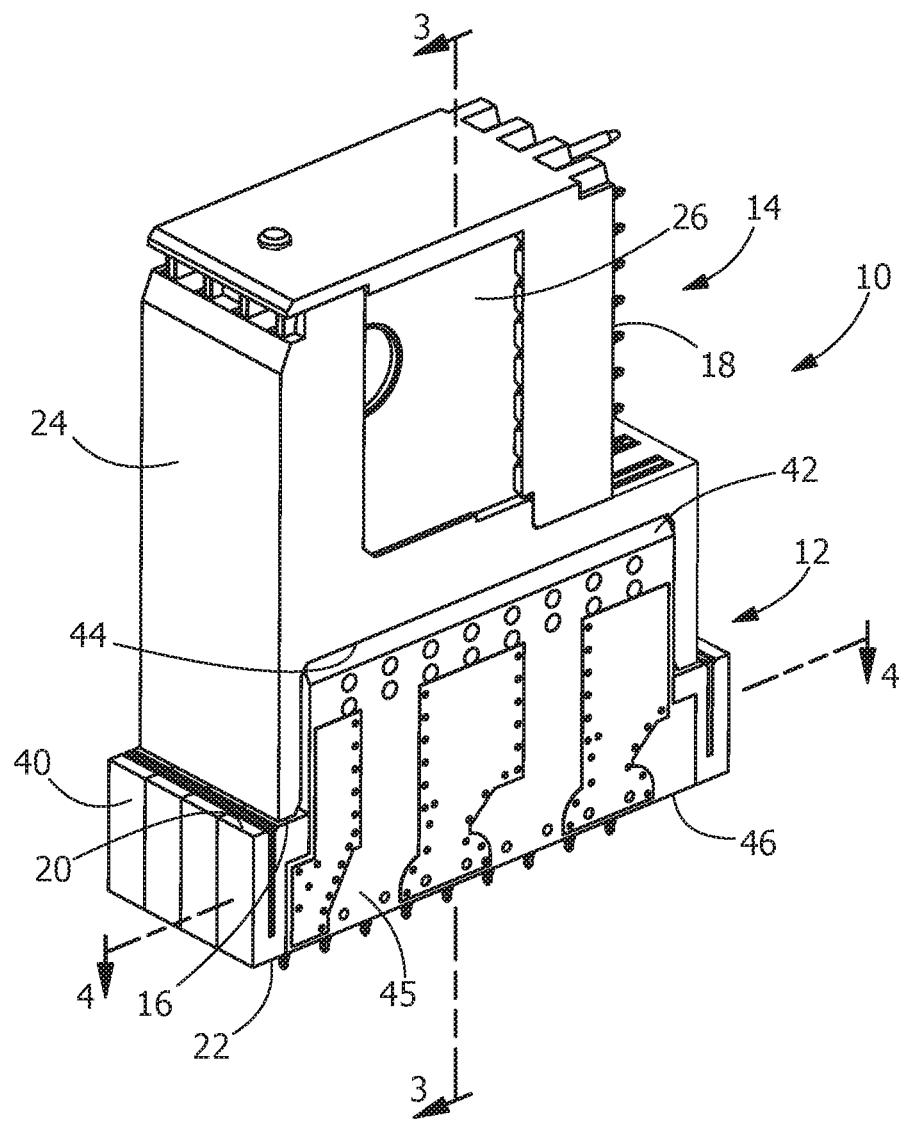
FIG. 2 is a perspective view of the backplane connector of the present invention mated with the daughtercard connector.
Figure 3:
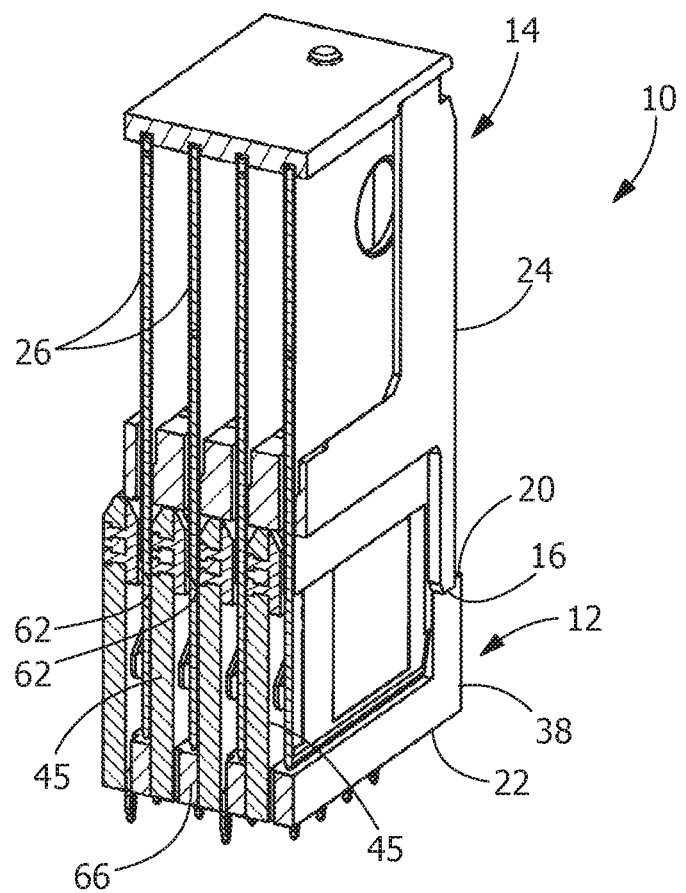
FIG. 3 is a perspective cross-sectional view of the daughtercard connector mated with the backplane connector, taken along line 3-3 of FIG. 2.
Figure 4:
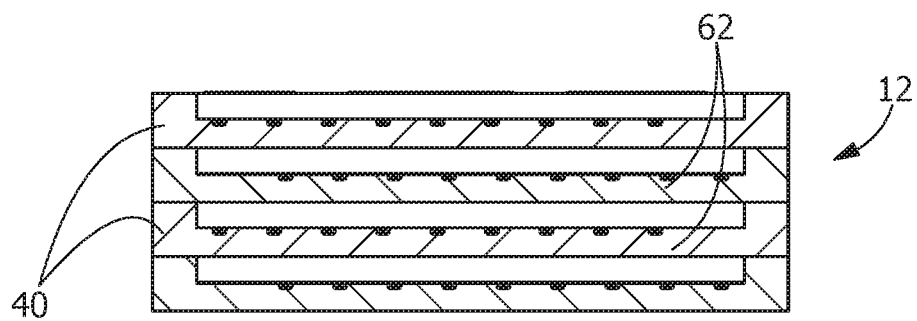
FIG. 4 is a cross-sectional view of the daughtercard connector mated with the backplane connector, taken along line 4-4 of FIG. 2.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

FIG. 1 illustrates an electrical connector system 10 formed in accordance with an illustrative embodiment. The electrical connector system 10 includes a backplane connector 12 and a daughtercard connector 14 that are used to electrically connect a backplane circuit board (not shown) and a daughtercard circuit board (not shown). While the electrical connector system 10 is described herein with reference to backplane connectors 12 and daughtercard connectors 14, it is realized that the subject matter herein may be utilized with different types of electrical connectors other than a backplane connector or a daughtercard connector. The backplane connector 12 and the daughtercard connector 14 are merely illustrative of an illustrative embodiment of an electrical connector system 10 that interconnects a particular type of circuit board, namely a backplane circuit board, with a daughtercard circuit board.

In the illustrated embodiment, the backplane connector 12 constitutes a header connector mounted to the backplane circuit board. The backplane connector 12 is mated to the daughtercard connector 14. When mated, the daughtercard circuit board is oriented generally perpendicular with respect to the backplane circuit board.

In the illustrative embodiment shown, the daughtercard connector 14 constitutes a right angle connector wherein a mating interface 16 and mounting interface 18 of the daughtercard connector 14 are oriented perpendicular to one another. The daughtercard connector 14 is mounted to the daughtercard circuit board at the mounting interface 18. Other orientations of the interfaces 16, 18 are possible in alternative embodiments.

The backplane connector 12 includes a mating interface 20 and a mounting interface 22 that are oriented generally parallel to one another. The backplane connector 12 is mounted to the backplane circuit board at the mounting interface 22. Other orientations of the interfaces 20, 22 are possible in alternative embodiments.

The daughtercard connector 14 includes a housing 24 holding a plurality of circuit boards 26 therein. The circuit boards 26 has pairs 28 of individual signal pathways or traces that extend between the mating interface 16 and the mounting interface 18. The signal traces have signal conductive pads 32 provided proximate the mating interface 16. The signal conductive pads 32 are configured to be mated with and electrically connected to the signal contacts 48 (FIG. 6) of the backplane connector 12. The circuit boards 26 has individual ground pathways or traces that extend between the mating interface 16 and the mounting interface 18. The ground traces have ground conductive pads 34 provided proximate the mating interface 16. The ground conductive pads 34 are configured to be mated with, and electrically connected to, the ground contacts 52 (FIG. 6) of the backplane connector 12. In alternative embodiments, the circuit boards 26 may be contact modules, the signal traces may be mating signal contacts and the ground traces may be ground contacts.

The backplane connector 12 includes a housing 38 which is made from a plurality of modules 40. Each of the modules 40 has a mating end 42, also referred to herein as a front 42, that is loaded into recess 44 of the daughtercard connector 14 during mating. Each of the modules 40 has a mounting end 46, also referred to herein as a rear 46, which is mounted to the backplane circuit board.

Figure 6:
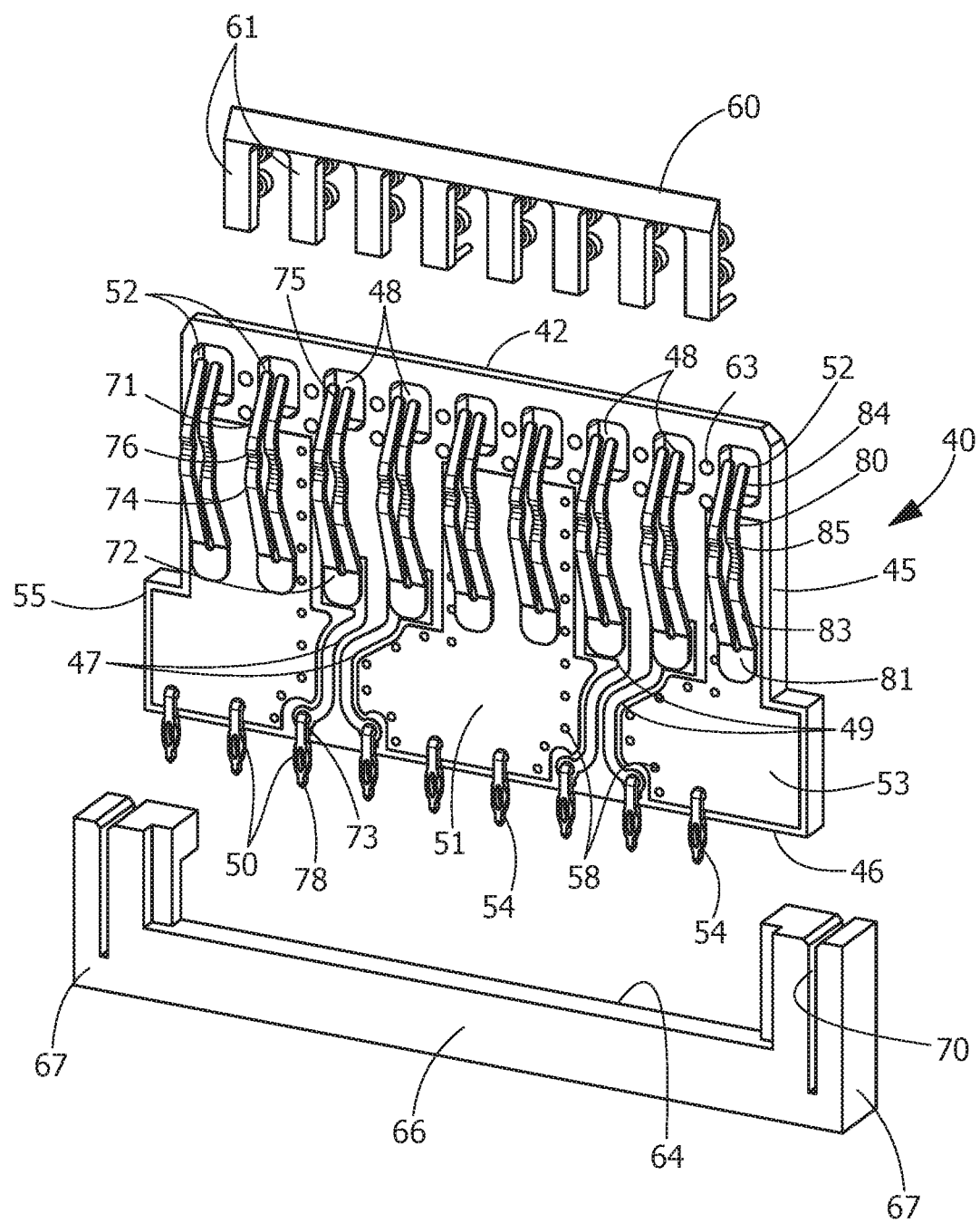
FIG. 6 is an exploded front perspective view of an overmolded chicklet or module of the backplane connector.

As shown in FIG. 6, each of the modules 40 has a circuit board or substrate 45 which holds a plurality of individual signal pathways 47 which include mating signal contacts 48, signal traces 49 and mounting signal contacts 50. The mating signal contacts 48 are mechanically and electrically connected to the signal traces 49 by known methods, such as but not limited to soldering to a conductive pad of the signal traces 49. The mounting signal contacts 50 are mechanically and electrically connected to the signal traces 49 by known methods, such as but not limited to soldering to a conductive pad of the signal traces 49. The signal pathways 47 extend between the mating end 42 and the mounting end 46. In an exemplary embodiment, the signal pathways 47 are arranged in pairs carrying differential signals. The individual signal pathways 47 are positioned on a first surface 55 of each module 40.

Each of the substrates 45 of the modules 40 holds a plurality of first ground pathways 51 which include mating ground contacts 52, ground traces 53 and mounting ground contacts 54. Each of the plurality of ground pathways 51 are positioned adjacent to at least one of the plurality of signal pathways 47. The mating ground contacts 52 are mechanically and electrically connected to the ground traces 53 by known methods, such as but not limited to soldering to a conductive pad of the ground traces 53. The mounting ground contacts 54 are mechanically and electrically connected to the ground traces 53 by known methods, such as but not limited to soldering to a conductive pad of the ground traces 53. The ground pathways 51 extend between the mating end 42 and the mounting end 46. The individual ground pathways 51 are positioned on the first surface 55 of each module 40.

Each of the substrates 45 of the modules 40 include second ground pathways or traces 56 on a second surface 57 of each module 40. The second surface 57 being opposed and spaced from the first surface 55. The second ground pathways or traces 56 extend between the mating end 42 and the mounting end 46. The individual ground pathways 51 are positioned on the first surface 55 of each module 40. The plurality of second ground pathways or traces 56 are positioned in line with the plurality of the signal pathways 47. Vias 58 extend from ground traces 53 on the first surface 55 through the substrate 45 to ground traces 56 on the second surface 57, thereby placing the ground traces 53 is electrical engagement with the ground traces 56. The vias 58 also providing shielding between pairs of the signal pathways 47. The combination of the ground traces 53 on the first surface 55, the ground traces 56 on the second surface 57 and the vias 58 form shielding cavities around the pairs of the signal pathways 47. The spacing of the ground traces 53, the ground traces 56 and the vias 58 is optimized for impedance control, as well as shielding.

Each of the modules 40 has a contact protection member 59 which is positioned on the first surface 55 of the substrates 45 proximate the mating end 42. The contact protection member 59 extends from the first surface 55 in a direction away from the second surface 57. The contact protection member 59 has a lead-in surface 60 and mounting projections 61. The mounting projections 61 cooperate with openings 63 of the substrates 45 to maintain the contact protection member 59 on the substrates 45. In the illustrative embodiment, the contact protection member 59 is overmolded on the substrate 45, however, the contact protection member 59 may be positioned and maintained on the substrate 45 by other known methods.

Figure 8:
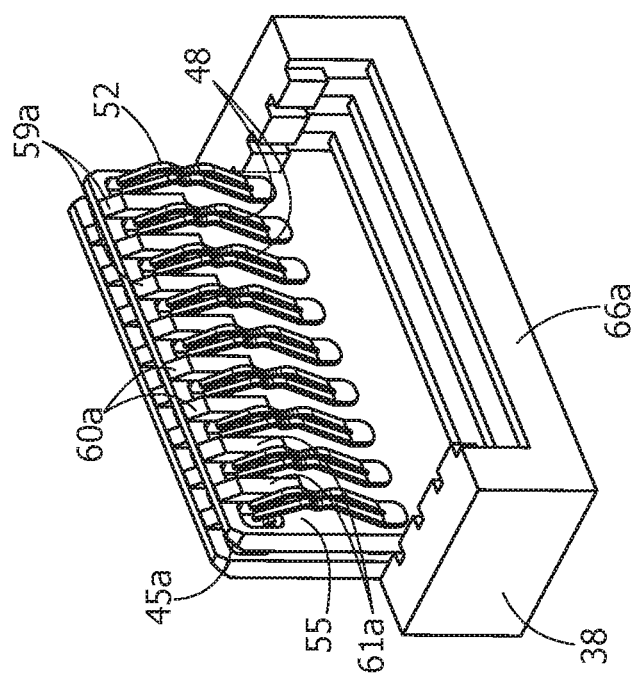
FIG. 8 is a front perspective view of a first alternate embodiment of a partially assembled backplane connector.

Other types of contact protection members 59a may be provided, as for example as shown in FIG. 8. In this illustrative embodiment, the contact projections members 59a are positioned on the first surface 55a of the substrates 45a proximate the mating end 42a. The contact protection members 59a extend from the first surfaces 55a in a direction away from the second surfaces 57a. The contact protection members 59a each have a lead-in surface 60a and a mounting projection 61a. The mounting projections 61a cooperate with opening 63a of the substrates 45a to maintain the contact protection members 59a on the substrates 45a. In the illustrative embodiment, the contact protection members 59a are overmolded on the substrates 45a.

Figure 5:
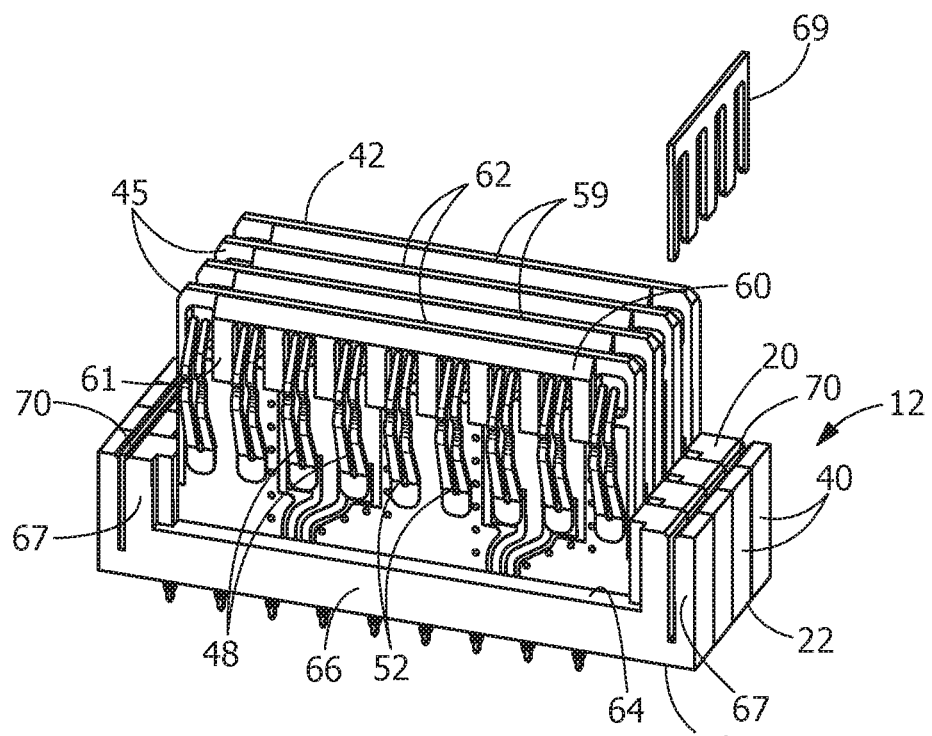
FIG. 5 is a perspective view of the backplane connector with a clip exploded therefrom.

In the illustrative embodiment shown in FIGS. 1 and 5, the housing 38 of the backplane connector 12 has four modules 40 which are positioned adjacent to each other. Circuit board receiving slots 62 are provided between adjacent modules 40. The circuit board receiving slots 62 are positioned adjacent the contact protection members 59 of the modules 40. Each circuit board receiving slot 62 extends from the mating end 42 of the modules 40 toward the mounting end 46.

Each module 40 has a base section 66 which extends from the mounting end 46 toward the mating end 42. The base section 66 has end sections 67 which extend beyond a connector receiving sections 64, as shown in FIG. 5. Each of the end sections 67 has a clip receiving slot 68 which extends from a top surface 69 of the end section 67 toward the mounting end 46. In the illustrative embodiment, the base sections 66 are overmolded on the substrates 45, however, the base sections 66 may be positioned and maintained on the substrates 45 by other known methods. Alternatively, the base section 67a of the housing 38a may be one piece in which the substrates 45a are mounted therein, as shown in FIG. 8.

When the modules 40 are properly assembled, as shown in FIG. 5, clips 69 are inserted into the clip receiving slots 68 to properly position and retain the modules 40 in position relative to each other. The clips 69 may have cavities 70 provided therein which cooperate with projections (not shown) in the clip receiving slots 68 to more accurately position and maintain the modules 40 relative to each other.

The mating signal contacts 48 have mating contact receiving sections 71 and securing sections 72. In the illustrative embodiment shown, each of the contact receiving sections 71 include two resilient arms 74 with lead in portions 75 and engagement portions 76. The resilient arms 74 are configured to press against the signal conductive pads 32 when the daughter card connector 14 is mated to the backplane connector 12. The securing sections 72 are configured to mount to the signal pathways 47 on the first surfaces 55 of the substrates 45. The mounting signal contacts 50 have mounting members 73 and compliant portions 78. The mounting members 73 are configured to mount to the signal pathways 47 on the first surfaces 55 of the substrates 45. The compliant portions 78 are configured to engage the printed circuit board (not shown). The compliant portions 78 may be, but are not limited to, an eye of the needle pin, although other configurations may be used.

The mating ground contacts 52 have mating contact receiving sections 80 and securing sections 81. In the illustrative embodiment shown, each of the contact receiving sections 80 include two resilient arms 83 with lead in portions 84 and engagement portions 85. The resilient arms 83 are configured to press against the ground conductive pads 34 when the daughter card connector 14 is mated to the backplane connector 12. The securing sections 81 are configured to mount to the ground pathways 52 on the first surfaces 55 of the substrates 45. The mating ground contacts 52 have mounting members 86 and compliant portions 87. The mounting members 86 are configured to mount to the ground pathways 52 on the first surfaces 55 of the substrates 45. The compliant portions 87 are configured to engage the printed circuit board (not shown). The compliant portions 87 may be, but are not limited to, an eye of the needle pin, although other configurations may be used.

Figure 7:
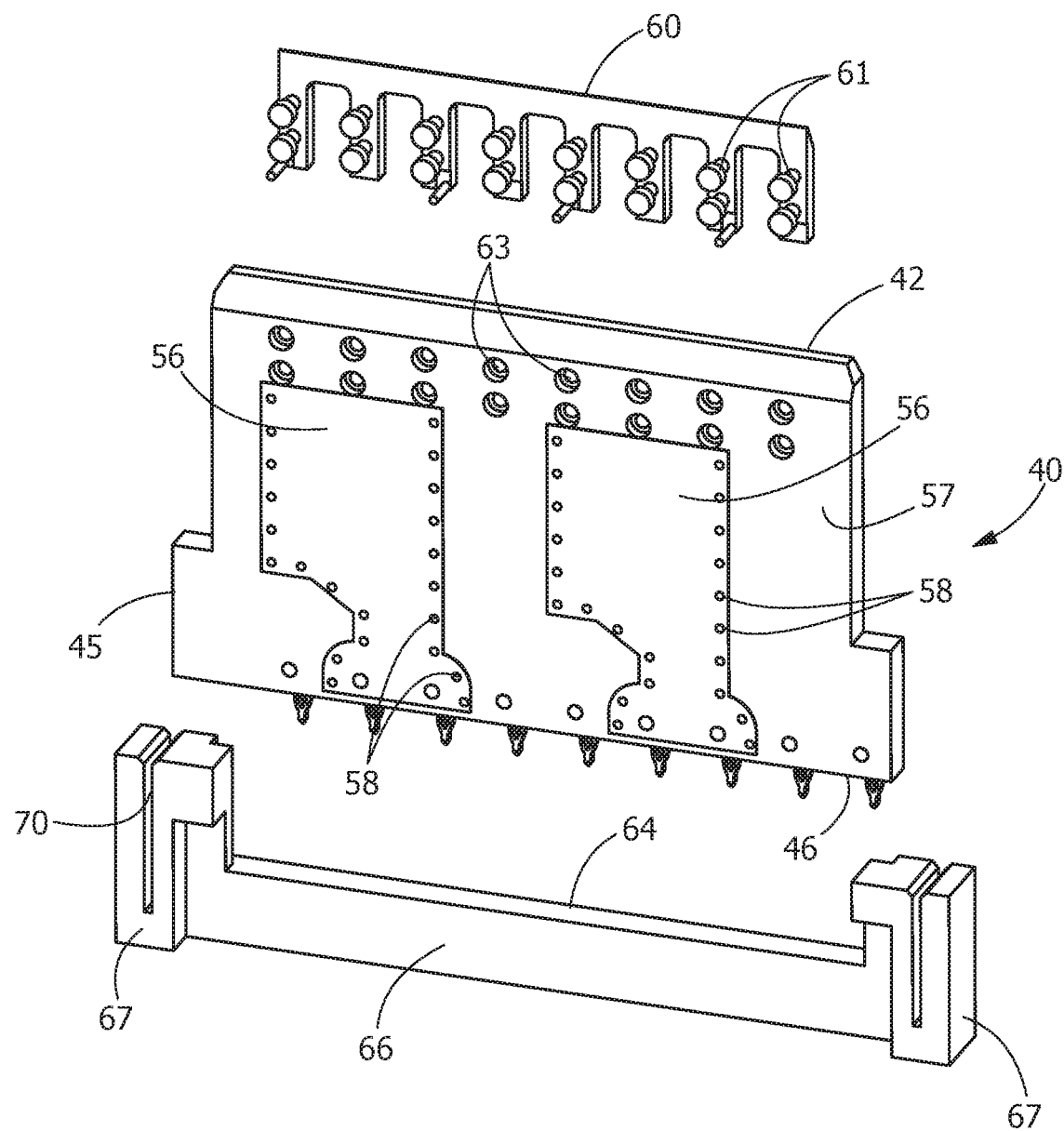
FIG. 7 is an exploded back perspective view of the overmolded chicklet or module of the backplane connector.

As shown in FIGS. 6 and 7, the combination of the ground pathways 51, the vias 58 and the ground traces 56 entirely peripherally surround the pairs of signal pathways 47. As the ground pathways 51, the vias 58 and the ground traces 56 are electrically commoned together, the ground pathways 51, the vias 58 and the ground traces 56 provide electrical shielding for the pairs of signal pathways 47. Gaps or spaces, which could allow EMI leakage between pairs of signal pathways 47, are minimal through or between the ground pathways 51, the vias 58 and the ground traces 56.

The ground pathways 51, the vias 58 and the ground traces 56 extend along multiple pairs of signal pathways 47. The ground pathways 51, the vias 58 and the ground traces 56 form cavities around the pairs of signal pathways 47. The cavities may have any shape depending on the shapes of the ground pathways 51, the vias 58 and the ground traces 56.

With the housing 38 properly assembled, the ground pathways 51, the vias 58 and the ground traces 56 extend about the periphery of the pairs of signal pathways 47 and surround the pairs of signal pathways 47 to provide electrical shielding for the pairs of signal pathways 47. In an exemplary embodiment, entire, 360 degree shielding is provided by the ground pathways 51, the vias 58 and the ground traces 56 along the length of the signal pathways 47. The ground pathways 51, the vias 58 and the ground traces 56 also surround portions of the mating signal traces when the connectors 12, 14 are mated. The ground pathways 51, the vias 58 and the ground traces 56 provide shielding along the entire mating interface with the mating signal traces. The ground pathways 51, the vias 58 and the ground traces 56 may control electrical characteristics at the mating interfaces 16, 20 and throughout the housing 38, such as by controlling cross talk, signal radiation, impedance or other electrical characteristics.

With the daughtercard connector 14 properly mated to the backplane connector 12, the circuit boards 26 of the daughter card connector 14 are positioned in the circuit board receiving slots 62. In this position, the mating signal contacts 48 of the signal pathways 47 of the modules 40 physically and electrically engage the signal conductive pads 32 of the signal traces of the circuit boards 26. The mating ground contacts 52 of the ground pathways 51 of the modules 40 are also placed in physical and electrical engagement with the ground conductive pads 34 of the ground traces of the circuit boards 26.

The ground pathways 51, the vias 58 and the ground traces 56 provide shielding for the mating signal contacts 48 and the portions of the signal conductive pads 32 of the signal traces of the circuit boards 26 which are positioned in the circuit board receiving slots 62 of the modules 40 of the housing 38 of the backplane connector 12.

Figure 9:
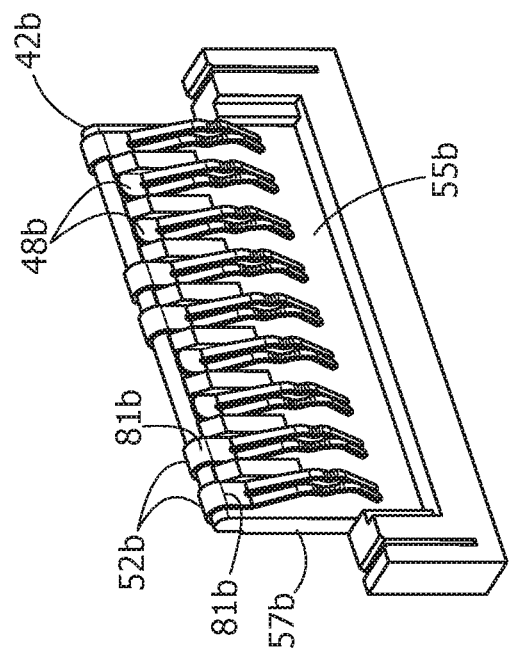
FIG. 9 is a front perspective view of a second alternate embodiment of a backplane connector.

Other embodiments of the signal contacts and ground contacts may be used without departing from the scope of the invention. For example, as shown in FIG. 9, the signal contacts 48b and the ground contacts 52b are rotated 180 degrees from the illustrative embodiments shown in FIGS. 1 through 8. In addition, the securing sections 81b of the ground contacts 52b extend from the first surface 55b, around the mating end 42b and are attached to the second surface 57b of the substrate 45b, thereby allowing the ground contacts 52b to be placed in electrical engagement with the ground traces on both the first surface 55b and the second surface 57b of the substrate 45b.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

We claim:

1. A circuit board for use in a modular electrical connector, the circuit board comprising: a first surface and an oppositely facing second surface; a plurality of signal pathways provided on the first surface; a plurality of first ground pathways provided on the first surface, each of the plurality of first ground pathways positioned adjacent to at least one of the plurality of signal pathways; a plurality of second ground pathways provided on the second surface, the plurality of second ground pathways are positioned in line with the plurality of the signal pathways; vias extend from the first plurality of ground pathways through the circuit board to the second plurality of ground pathways, thereby placing the first plurality of ground pathways in electrical engagement with the second plurality of ground pathways; wherein the first plurality of ground pathways, the vias and the second plurality of ground pathways provide 360 degree shielding along the length of the multiple pairs of the plurality of signal pathways and form cavities around the multiple pairs of the plurality of signal pathways to minimize gaps or spaces, which could allow EMI leakage between pairs of signal pathways to provide electrical shielding for the multiple pairs of the plurality of signal pathways; wherein the first plurality of ground pathways, the vias and the second plurality of ground pathways extend to a mating interface of the circuit board to control electrical characteristics at the mating interface by controlling cross talk, signal radiation and impedance; wherein a contact protection member is provided on the first surface of the circuit board proximate a mating end, the contact protection member extends from the first surface in a direction away from the second surface.

2. The circuit board as recited in claim 1, wherein the plurality of signal pathways have mating signal contacts, signal traces and mounting signal contacts.

3. The circuit board as recited in claim 2, wherein the signal pathways extend between the mating end and a mounting end of the circuit board.

4. The circuit board as recited in claim 3, wherein the plurality of signal pathways are arranged in pairs carrying differential signals.

5. The circuit board as recited in claim 4, wherein the plurality of first ground pathways have mating ground contacts, first ground traces and mounting ground contacts.

6. The circuit board as recited in claim 5, wherein the first ground pathways extend between the mating end and the mounting end.

7. The circuit board as recited in claim 6, wherein the second ground pathways extend between the mating end and the mounting end.

8. The circuit board as recited in claim 7, wherein the mating signal contacts have first mating contact receiving sections and first securing sections.

9. The circuit board as recited in claim 8, wherein each of the first mating contact receiving sections has two resilient arms with lead in portions and engagement portions.

10. The circuit board as recited in claim 9, wherein the mounting signal contacts have first mounting members and first compliant portions.

11. The circuit board as recited in claim 10, wherein the mating ground contacts have second mating contact receiving sections and second securing sections.

12. The circuit board as recited in claim 11, wherein each of the second mating contact receiving sections has two resilient arms with lead in portions and engagement portions.

13. The circuit board as recited in claim 12, wherein the mounting ground contacts have second mounting members and second compliant portions.

14. The circuit board as recited in claim 1, wherein the contact protection member has a lead-in surface and mounting projections, the mounting projections cooperate with openings of the circuit board to maintain the contact protection member on the circuit board.

15. A modular electrical connector comprising: a housing having modules positioned therein, the modules having circuit boards, the circuit boards comprising: a first surface and an oppositely facing second surface; signal pathways provided on the first surface; first ground pathways provided on the first surface, each of the first ground pathways positioned adjacent at least one of the signal pathways; second ground pathways provided on the second surface, the second ground pathways are positioned in line with the signal pathways; vias extend from the first ground pathways through the circuit board to the second ground pathways, thereby placing the first ground pathways in electrical engagement with the second ground pathways; wherein the combination of the first ground pathways, the vias and the second ground pathways of the circuit boards of the modules entirely peripherally surround pairs of signal pathways to minimize gaps or spaces, which could allow EMI leakage between pairs of signal pathways to provide electrical shielding for the pairs of signal pathways; wherein a contact protection member is provided on the first surface of the circuit board proximate a mating end, the contact protection member extends from the first surface in a direction away from the second surface.

16. The modular electrical connector as recited in claim 15, wherein the signal pathways extend between the mating end and a mounting end of the circuit board, the signal pathways are arranged in pairs carrying differential signals, the signal pathways have mating signal contacts, signal traces and mounting signal contacts.

17. The modular electrical connector as recited in claim 16, wherein the first ground pathways extend between the mating end and a mounting end of the circuit board, the first ground pathways have mating ground contacts, first ground traces and mounting ground contacts.

18. The modular electrical connector as recited in claim 17, wherein the second ground pathways extend between the mating end and the mounting end.

19. The modular electrical connector as recited in claim 18, wherein the mating signal contacts have first mating contact receiving sections and first securing sections, each of the first mating contact receiving sections has two resilient arms with lead in portions and engagement portions, the mounting signal contacts have first mounting members and first compliant portions.

\* \* \* \* \*